United States Patent
Asnaashari

Patent Number: 5,928,370
Date of Patent: Jul. 27, 1999

[54] METHOD AND APPARATUS FOR VERIFYING ERASURE OF MEMORY BLOCKS WITHIN A NON-VOLATILE MEMORY STRUCTURE

[75] Inventor: Mehdi Asnaashari, San Jose, Calif.

[73] Assignee: Lexar Media, Inc., Fremont, Calif.

[21] Appl. No.: 08/795,072

[22] Filed: Feb. 5, 1997

[51] Int. Cl.⁶ ..................................................... G06F 11/00
[52] U.S. Cl. .............................. 714/48; 714/42; 714/722; 365/185.29; 365/185.33
[58] Field of Search ........................ 395/185.01, 183.18, 395/185.07; 371/21.2, 21.1, 21.5; 365/185.29, 185.33

[56] References Cited

U.S. PATENT DOCUMENTS

| | | | |
|---|---|---|---|
| 4,210,959 | 7/1980 | Wozniak | 364/200 |
| 4,355,376 | 10/1982 | Gould | 365/200 |

(List continued on next page.)

FOREIGN PATENT DOCUMENTS

| | | | |
|---|---|---|---|
| 0 557 723 | 1/1987 | Australia | G11C 5/00 |
| 0 220 718 A2 | 5/1987 | European Pat. Off. | G06F 15/40 |
| 0 243 503 A1 | 11/1987 | European Pat. Off. | G11B 20/10 |
| 0 424 191 A2 | 4/1991 | European Pat. Off. | G06F 11/00 |
| 0 489 204 A1 | 6/1992 | European Pat. Off. | G11C 16/06 |
| 0 522 780 A2 | 1/1993 | European Pat. Off. | G06F 3/06 |
| 0 544 252 A2 | 6/1993 | European Pat. Off. | G11C 16/06 |
| 0 686 976 A2 | 12/1995 | European Pat. Off. | G11C 16/06 |

(List continued on next page.)

OTHER PUBLICATIONS

ISBN 0–07–031556–6 Book—*Computer Architecture and Parallel Processing*, Kai Hwang & Faye A. Briggs, McGraw–Hill Book Co., © 1984, p. 64.

1990 WL 2208325 Magazine–"State of the Art: Magnetic VS. Optical Store Data in a Flash", by Walter Lahti and Dean McCarron, Byte magazine dated Nov. 1, 1990, 311, vol. 15, No. 12.

G11C16/06 P4A1 Magazine—Technology Updates, Integrated Circuits, "1–Mbit flash memories seek their role in system design", Ron Wilson, Senior Editor, Computer Design magazine 28 (1989) Mar. 1, No.5, Tulsa OK, US, pp. 30 and 32.

Serial 9Mb F 1992 Symposium of VLSI Circuits Digest of Technical Papers, "EEPROM for Solid State Disk Applications", S. Mehoura et al., SunDisk Corporation, Santa Clara, CA. R. W. Gregor et al., AT&T Bell Laboratories, Allentown, PA, pp. 24 and 25.

*Primary Examiner*—Joseph E. Palys
*Assistant Examiner*—Scott T. Baderman
*Attorney, Agent, or Firm*—Maryam Imam

[57] ABSTRACT

In a digital system having non-volatile memory devices for storage of digital information therein, the digital information being organized in sectors, each sector having a data field and a corresponding extension field, a controller device for performing operations such as reading and writing to and erasing information from a selected plurality of sectors and further verifying successful erasure of the selected erased sectors, the controller device including an error detection circuit for detecting errors within each of the sector data fields using the corresponding sector extension field and a flash interface circuit coupled to the non-volatile devices through a data bus for receiving an erased sector of information therethrough and being operative to pass the data field of the erased sector information and a predetermined extension field to the error detection circuit wherein the error detection circuit calculates an extension field corresponding to the erased sector data field, compares the calculated extension field to the predetermined extension field and upon the calculated extension field not matching the predetermined extension field, detects an error in the erased sector.

21 Claims, 6 Drawing Sheets

U.S. PATENT DOCUMENTS

| | | | |
|---|---|---|---|
| 4,405,952 | 9/1983 | Slakmon | 360/49 |
| 4,450,559 | 5/1984 | Bond et al. | 371/10 |
| 4,456,971 | 6/1984 | Fukuda et al. | 364/900 |
| 4,498,146 | 2/1985 | Martinez | 364/900 |
| 4,525,839 | 7/1985 | Nozawa et al. | 371/38 |
| 4,616,311 | 10/1986 | Sato | 364/200 |
| 4,654,847 | 3/1987 | Dutton | 371/10 |
| 4,710,871 | 12/1987 | Belknap et al. | 364/200 |
| 4,746,998 | 5/1988 | Robinson et al. | 360/72.1 |
| 4,748,320 | 5/1988 | Yorimoto et al. | 235/492 |
| 4,757,474 | 7/1988 | Fukushi et al. | 365/189 |
| 4,774,700 | 9/1988 | Satoh et al. | 369/54 |
| 4,800,520 | 1/1989 | Iijima | 364/900 |
| 4,896,262 | 1/1990 | Wayama et al. | 364/200 |
| 4,914,529 | 4/1990 | Bonke | 360/48 |
| 4,920,518 | 4/1990 | Nakamura et al. | 365/228 |
| 4,924,331 | 5/1990 | Robinson et al. | 360/72.1 |
| 4,953,122 | 8/1990 | Williams | 364/900 |
| 5,070,474 | 12/1991 | Tuma et al. | 395/500 |
| 5,226,168 | 7/1993 | Kobayashi et al. | 395/800 |
| 5,270,979 | 12/1993 | Harari et al. | 365/218 |
| 5,297,148 | 3/1994 | Harari et al. | 371/10.2 |
| 5,303,198 | 4/1994 | Adachi et al. | 365/218 |
| 5,337,275 | 8/1994 | Garner | 365/189.01 |
| 5,341,330 | 8/1994 | Wells et al. | 365/185 |
| 5,341,339 | 8/1994 | Wells | 365/218 |
| 5,353,256 | 10/1994 | Fandrich et al. | 365/230.03 |
| 5,357,475 | 10/1994 | Hasbun et al. | 365/218 |
| 5,388,083 | 2/1995 | Assar et al. | 365/218 |
| 5,400,287 | 3/1995 | Fuchigami | 365/218 |
| 5,414,664 | 5/1995 | Lin et al. | 365/218 |
| 5,430,859 | 7/1995 | Norman et al. | 395/425 |
| 5,448,712 | 9/1995 | Kynett et al. | 711/103 |
| 5,479,638 | 12/1995 | Assar et al. | 395/430 |
| 5,485,595 | 1/1996 | Assar et al. | 395/430 |
| 5,524,230 | 6/1996 | Sakaue et al. | 395/430 |
| 5,544,356 | 8/1996 | Robinson et al. | 395/600 |
| 5,566,314 | 10/1996 | DeMarco et al. | 395/430 |
| 5,574,684 | 11/1996 | Tomoeda | 371/21.1 |
| 5,596,530 | 1/1997 | Lin et al. | 365/185.29 |
| 5,675,537 | 10/1997 | Bill et al. | 365/185.22 |
| 5,719,808 | 2/1998 | Harari et al. | 365/185.33 |

FOREIGN PATENT DOCUMENTS

| | | | |
|---|---|---|---|
| 93 01908 | 8/1993 | France | G06F 12/02 |
| 59-45695 | 9/1982 | Japan | G11C 17/00 |
| 58-215794 | 12/1983 | Japan | G11C 17/00 |
| 58-215795 | 12/1983 | Japan | G11C 17/00 |
| 59-162695 | 9/1984 | Japan | G11C 17/00 |
| 60-212900 | of 1985 | Japan | G11C 29/00 |
| 61-96598 | 5/1986 | Japan | G11C 17/00 |
| 62-283496 | 12/1987 | Japan | G11C 17/00 |
| 62-283497 | 12/1987 | Japan | G11C 17/00 |
| 63-183700 | 7/1988 | Japan | G11C 17/00 |
| 4-332999 | 11/1992 | Japan | G11C 29/00 |
| 84/00628 | 2/1984 | WIPO | G06F 11/20 |

METHOD AND APPARATUS FOR VERIFYING ERASURE OF MEMORY BLOCKS WITHIN A NON-VOLATILE MEMORY STRUCTURE

FIELD OF THE INVENTION

The present invention relates generally to mass storage employed in digital systems for storing large quantities of information and more particularly to computer systems using electrically-erasable programmable read-only-memory (EEPROMs) or flash memory for replacing hard disk as mass storage.

BACKGROUND OF THE INVENTION

With the advent of small digital circuitry, there has been a fast-emerging industry in the area of digital systems employing memory products capable of maintaining charge storage even when power is no longer available to the system. Such products comprise of hand-held or palm-held digital personal computers (PCS), digital cameras, solid state floppy disks, and the like. These products typically employ non-volatile memories in order to retain the information being stored even when power is no longer supplied to the system. Non-volatile memory may be in the form of read-only-memory (ROM), programmable read-only-memory (PROM), electrically-erasable programmable read-only-memory (EEPROM) or flash memory.

The use of flash memories in small portable computers, is due in part to their capability to store a large amount of information in digital form while allowing fast retrieval of the stored information. Solid state memory such as in the form of flash memory is therefore an appealing alternative to the use of hard disk drives for mass storage in portable computers. Other reasons for the replacement of hard disks with flash memory are robustness and lower power consumption.

That is, hard disks are unable to withstand many of the kinds of physical shock that a portable computer will likely sustain. Additionally, the motor for rotating the disk consumes significant amounts of power thereby decreasing the battery life for portable computers. Flash memory chips however, for reasons of lacking mechanical components and various electrical characteristics associated therewith, generally consume less power than consumed by hard disk drives.

Flash memory is an array of transistor memory cells with each cell being programmable through hot electron, source injection, or tunneling, and erasable through Fowler-Nordheim tunneling. The programming and erasing of such a memory cell requires current to pass through the dielectric surrounding floating gate electrode causing such types of memory to have a finite number of erase-write cycles (a flash memory cell previously written can not be over-written before first being erased) prior to the deterioration of dielectric. Manufacturers of flash cell devices specify the limit for the number of erase-write cycles between 100,000 and 1,000,000.

One requirement for a semiconductor mass storage device to be successfully employed in lieu of a rotating media hard disk mass storage device is that such substitution must be transparent to the designer and the user of a system using such a device. In other words, the designer or user of a computer incorporating such a semiconductor mass storage device could simply remove the hard disk and replace it with a semiconductor mass storage device. Among other reasons, this allows all presently-available commercial software to operate on a system employing such a semiconductor mass storage device without the necessity of any modification. To replace the typical hard disk drive in PCs then, flash memory devices must readily read and write data being stored therein. Furthermore, as noted earlier, using flash memory devices requires erasing operations to be performed on flash cells in order to allow re-use thereof. However, due to the structure of flash cells, erase operations are not always conducted successfully. In order to assure appropriate erasure of cells, a system employing flash memory devices checks and verifies the outcome of an erase operation otherwise, the memory cell being programmed is likely to be effectively inoperative.

Upon detection of errors after the completion of an erase operation, it may be very important to determine which blocks, if any, within the flash memory devices, or which sectors within a block are in error. To date, prior art techniques either locate errors within a block in an inefficient manner thereby significantly contributing to reduction of system performance or are simply wasteful of what could be very expensive flash memory. It is therefore pertinent to devise a method and apparatus for locating errors, within a block (sector or byte, as the case may be) that has been detected as having errors, in an efficient and inexpensive manner. At this time, a general understanding of the structure and format of a hard disk drive is provided.

As is well known to designers in the PC industry, information that is stored in typical hard disk drives of PCs is organized in the form of sectors. Each sector is apportioned to include user data and extension information (sometimes referred to as overhead or header field). FIG. 1 shows an example of a sector 10, illustrated to include 512 bytes of data 12(each byte being 8 bits) and 12 bytes of overhead information or extension 14. Extension field 14 is further shown to include an error detection/correction portion 16 and a sector book-keeping portion, which are each 6 bytes, for storing the sector's overhead information. The extension field 14 may include information regarding defects in a sector, error correction codes (ECC) in association with the sector data and other information that the designer of a disk drive system may need for employing a particular sector format as may be specified by the manufacturer of a disk drive. The discussion concerning sector organization is briefly interrupted to provide the reader with an overview on the incorporation of the sector format within a PC system.

FIG. 2 illustrates a portable PC system 17 (such as a notebook, palm-held or hand-held computer) having a PCM-CIA card slot 18 for coupling a PC ATA card 20, having electronics circuitry residing thereon, into the host computer 22 for communication of digital information therebetween when the PC ATA card 20 is inserted in the PCMCIA slot 18. The PC ATA card 20 may be a substitute for the PC system's hard disk (or enhancement thereof) such that data that is normally stored in a hard disk drive is instead stored in and retrieved from the PC ATA card. This clearly contributes to the compactness of the PC system 17 since PC ATA cards are generally much smaller in-size than hard disk drives. While not shown in FIG. 2, non-volatile (more specifically, flash) memory chips for storage of data and a microprocessor or microcontroller along with appropriate ROM and/or RAM memory devices are generally included in the PC card 20. The electronic circuitry residing on PC ATA card 20 may be alternatively an embedded rather than a removable structure permanently included within the computer 22. As is appreciated by those of ordinary skill in the art, the PCMCIA slot 18 may alternatively use interfaces other than a PCMCIA interface. Such other interfaces include PC card, compact flash, ATA, PCI, parallel, serially, etc.

Turning the discussion back to the need for a method of determining which block section or byte has caused an erase operation to fail, the reader is reminded that in order to perform valid operations on the data being stored in flash memory chips, it is necessary to locate the block, sector, or byte that has caused the erase operation to fail and marking it defective so as to minimize the risk of using a defective or incompletely-erased area of memory for data storage. FIG. 3 provides a flow chart of a prior art method for verification of erase operations. Normally, the microprocessor, residing in PC card 20 (in FIG. 2, executes software program code designed to perform the steps outlined in FIG. 3 from the ROM or RAM memories residing on the PC card.

Typically, erasing is performed on a group of sectors, referred to as a block, and therefore checking for successful erases is similarly performed on a block. Initially, in steps 22, counter CNTR A is set equal to the number of sectors within a block that are to be checked. Using the 256-sector block size example, CNR A is set equal to the value of 256. A second counter, in step 24, namely counter CNTR B, is set equal to the number of bytes within a sector. Using the 512-byte sector size example of FIG. 1, CNTR B is set equal to the value 512, which represents 512 bytes of sector data. In step 26, a loop begins with the first byte of the first sector within the block being read. Next, the byte that is read is compared to the value 'FF' (hexadecimal notation) as shown by step 28. The reason for this comparison is due to the erasure characteristics of flash memory cells, i.e. successful erasure of a cell should effect a digital value of '1' upon reading of the cell. Thus, where a cell stores one bit of data, reading one byte of data should result in the value 'FF' if all of the cells within the byte are appropriately erased.

In FIG. 3, if the result of the comparison yields a match between the byte read and the value 'FF', the counter CNTR B is decremented by one. In this example, CNTR B would be 511 after it is decremented (step 30) and if the value in CNTR B is not zero (or the last byte of the first sector is not yet checked) steps 26–32 are repeated a total of 512 times.

Referring back to step 28, if any of the bytes are not read as having the value 'FF', the entire sector is marked defective (step 34) and the loop is exited. Upon either completion of the loop or detection of a defective sector, counter CNTR A is decremented by one in step 36 in preparation for verification of the next sector. In step 38, counter CNTR A is compared to zero for a determination of whether all of the sectors have been verified and if not counter CNTR B is again reset to the value representing the number of bytes in a sector; in our example this value is 512. Steps 26–32 are again repeated 512 times until all of the sectors have been checked for defects.

One problem arising in prior art systems using techniques similar to that shown in FIG. 3 is that a long time is required for checking a block of sectors for appropriate erasure thereof. This is due to two factors, one is that a microprocessor is executing software code check for errors which is a very slow process. For example, a microprocessor used in solid state storage cards (i.e. PC card 20 in FIG. 2) typically executes an instruction in 4 instruction cycles, with each instruction cycle requiring 50 nanoseconds to execute. Each of the steps outlined in FIG. 3 is executed using at least one microprocessor program instruction, which is very time consuming thereby resulting in a reduction of system performance.

As is clear to those skilled in the art, the larger the block size, the longer time needed for checking for proper erasure of sectors. Therefore, the system of prior art, as shown to perform in accordance with FIG. 3 significantly decreases system performance particularly when larger block sizes are employed. Furthermore, flash memory characteristically has tendency to fail more often as it is further used. In other words, an old flash memory device that has been in frequent operation, is likely to return errors when being read, written to or erased. In this respect, the method of prior art systems requiring lengthy check for erase times, are even less effective when used with aged flash devices. This gain leads to significant system degradation as the prior art system in continuously in operation.

One of the factors leading to degradation of system performance using prior art techniques is the number of times instructions are repeated in order to check a block of sectors. In fact, the number of times instructions are repeated is directly correlated with the size of the block being checked for proper erasure, i.e. the larger the block, the longer the time required for verifying whether the block was properly erased. To use the above example, steps 26–32 in FIG. 3 are executed 512 times per sector if no defective byte is detected. Since each sector contains 512 bytes, steps 26–32 as shown in FIG. 3 are executed up to a total of 512×256 times and steps 36 and 38 as shown in FIG. 3, are executed 256 times, with each instruction requiring at least 4 program instruction cycles to execute. Therefore, at least 21.5 milliseconds are required to verify a block having 256 sectors using the prior art technique of FIG. 3.

In other prior art methods, when a block is found to be defective after the performance of an erase operation, it is likely to be discarded and not used further. This technique is especially prevalent in systems using small block sizes such as for example, 4K byte block size. Systems doing so, generally balance the waste in discarding blocks against the benefit in saving time by eliminating identification of particular sector or byte within the block that are causing errors and find such waste to be tolerable generally for small block sizes. However, efficient ways of identifying errors within a sector or byte inside of a block are likely to prevent the need for such waste of memory in prior art system. Additionally, with larger block sizes, it becomes important to reuse a block that has been found defective if the area in which error(s) exist can be identified and discarded.

As can be appreciated, a system is needed to efficiently locate a sector within a block that has failed the erase operation without degrading system performance. Such a system has particular application in PC systems employing flash memory devices to replace and/or enhance hard disk drives as mass storage wherein erase operations are frequently required to allow write operations to the same location performed on non-volatile solid state memory devices employed in digital systems without degrading system performance.

SUMMARY OF THE INVENTION

An object of the present invention is to provide a method and apparatus for detecting errors located within sector-organized selected blocks of information of solid state non-volatile memory devices, the selected blocks of information having been erased and thereafter identified as being defective.

An object of the present invention is to provide a method and apparatus whereupon after the completion of an erase operation performed on selected block(s) of sector-organized information within a solid state non-volatile memory device, the selected block is verified for successful erasure thereof and upon unsuccessful erasure, errors are located within the selected block.

Another object of the invention as described herein is to maximize system performance by increasing the efficiency of checking for proper erasure of solid state non-volatile memory devices employed in a computer system for use as mass storage such as to replace hard disk drives.

A still further object is to reduce the time necessary for checking the validity of an erase operation performed on a group of sectors of information by reducing the number of program instructions executed for verification of the erase operation and identification of errors located within the sectors.

Briefly, the preferred embodiment includes a controller device for use in a digital system having non-volatile memory devices for storing sector-organized, digital information therein with each sector having a data field and a corresponding extension field wherein the controller device causes writing, reading and erasing operations to be performed on a selected plurality of sectors, the controller further verifying the erase operation for proper erasure of the selected sectors and upon detection of defective sector(s), identifying the location of errors within the defective sector (s). The controller device includes an error detection circuit for detecting errors within each of the sector data fields using the corresponding sector extension field and a flash interface circuit responsive to a data bus coupled to the non-volatile devices for receiving an erased sector of information from the non-volatile devices and being operative to pass the data field of the erased sector information and a predetermined extension field to the error detection circuit wherein the error detection circuit calculates an extension field corresponding to the erased sector data field, compares the calculated extension field to the predetermined extension field and upon the calculated extension field not matching the predetermined extension field, detects an error in the erased sector.

The foregoing and other objects, features and advantages of the invention will be apparent from the following detailed description of the preferred embodiment(s) which make(s) reference to the several figures of the drawing.

DESCRIPTION OF THE PREFERRED EMBODIMENTS

Figure 4:
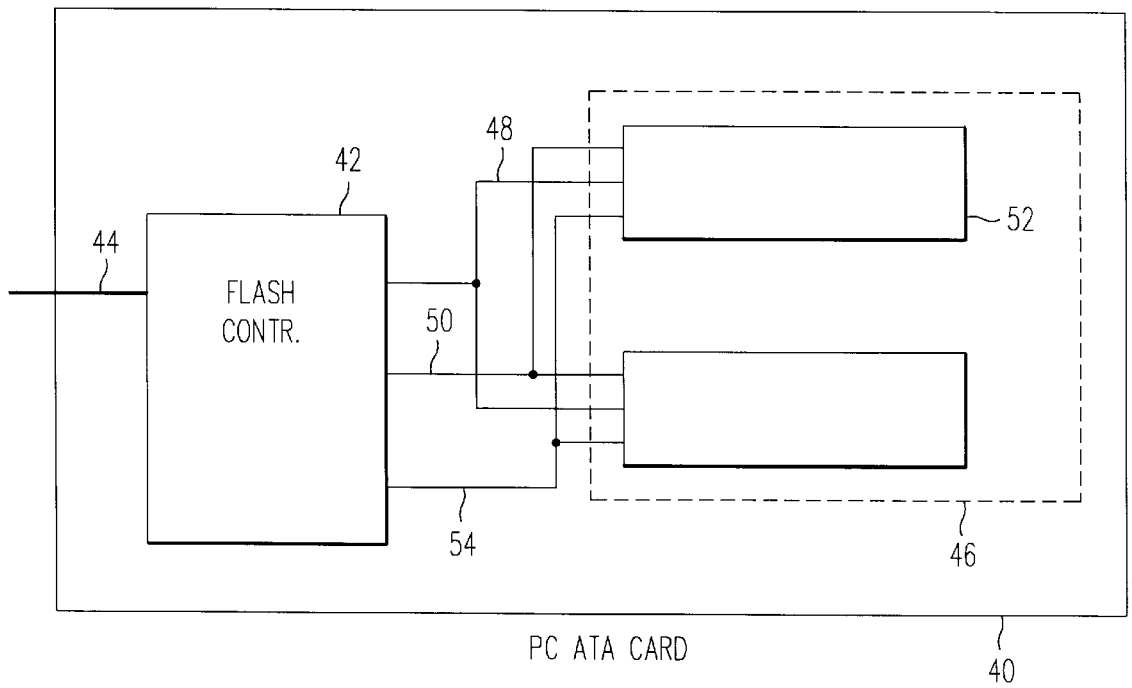
FIG. 4 shows a high-level block diagram of the PC ATA card including a controller and flash memory devices as employed in a preferred embodiment PC ATA card.

Referring now to FIG. 4 of the drawing, PC ATA card 40, which may be connected to a PCMCIA card slot in a portable PC (not shown) is illustrated to include a Flash controller integrated circuit (IC or chip) 42 coupled to the PC (sometimes referred to as host) through the host interface bus 44. Flash controller 42 is further shown coupled to an array of Flash memory chips 46 through the flash data bus 54, flash address bus 48 and flash control bus 50 to transfer information on the flash data bus 54 between the controller 42 and the memory chips 46. Among other operations performed by the controller 42 are included, reading, erasing of, and writing information to the array of memory chips 46. Due to the intrinsic behavior of flash memory chips, prior to the writing of information to a particular area in memory, the area being written into must first be erased otherwise, data is likely to be erroneously stored and therefore unreliably retrieved.

Figure 1:
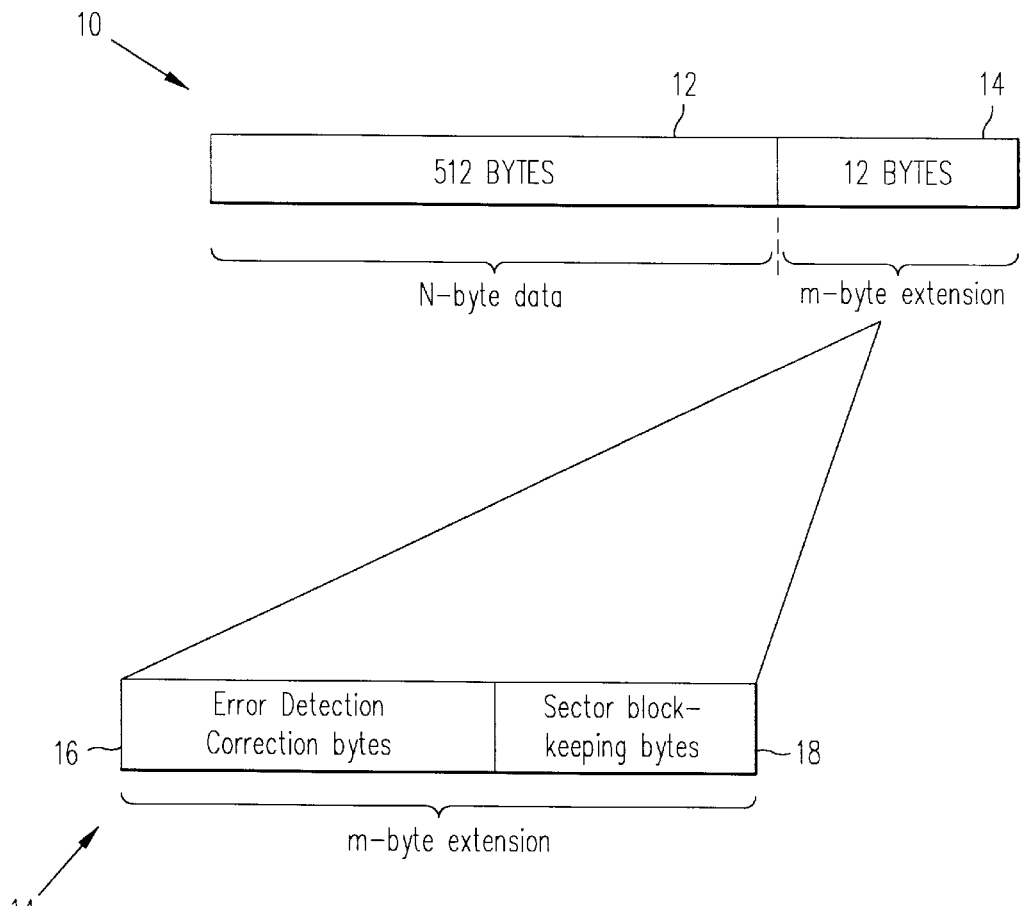
FIG. 1 shows the format of a commonly-employed sector of information.
Figure 2:
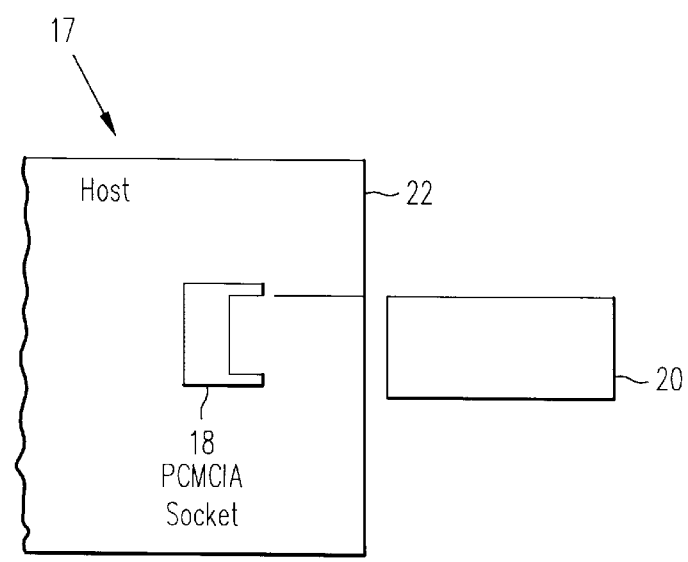
FIG. 2 shows a schematic diagram of a prior art PC system including a removable PC ATA card.
Figure 5:
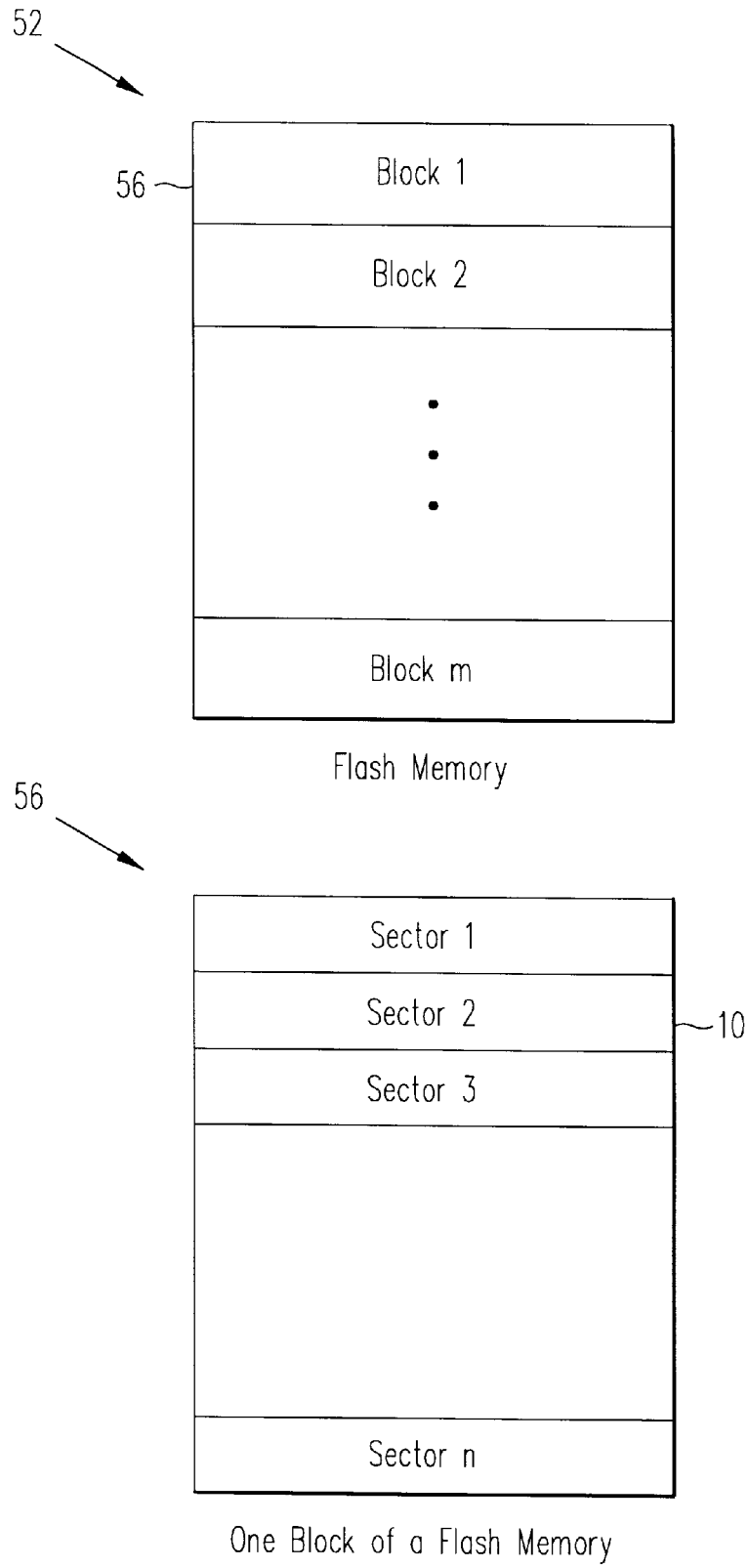
FIG. 5 illustrates the organization of blocks of sectors within a flash memory device in a preferred embodiment of the present invention.

The array of flash memory chips 46 includes multiple memory chips, each memory chip designated as 52 in FIG. 4. Each memory chip 52 of the preferred embodiment is capable of storing much more than a sector of data, each sector being for example, 512 bytes. Currently-available flash memory chips are typically manufactured to hold 64M bits of storage capacity. In FIG. 5, each memory chip 52 is shown to be capable of storing an integer number (M) of blocks of data with each block of data 56 shown to include an N-number of sectors. Each sector 10, in FIG. 5, is organized in much the same way as discussed previously in reference to FIG. 1.

Figure 6:
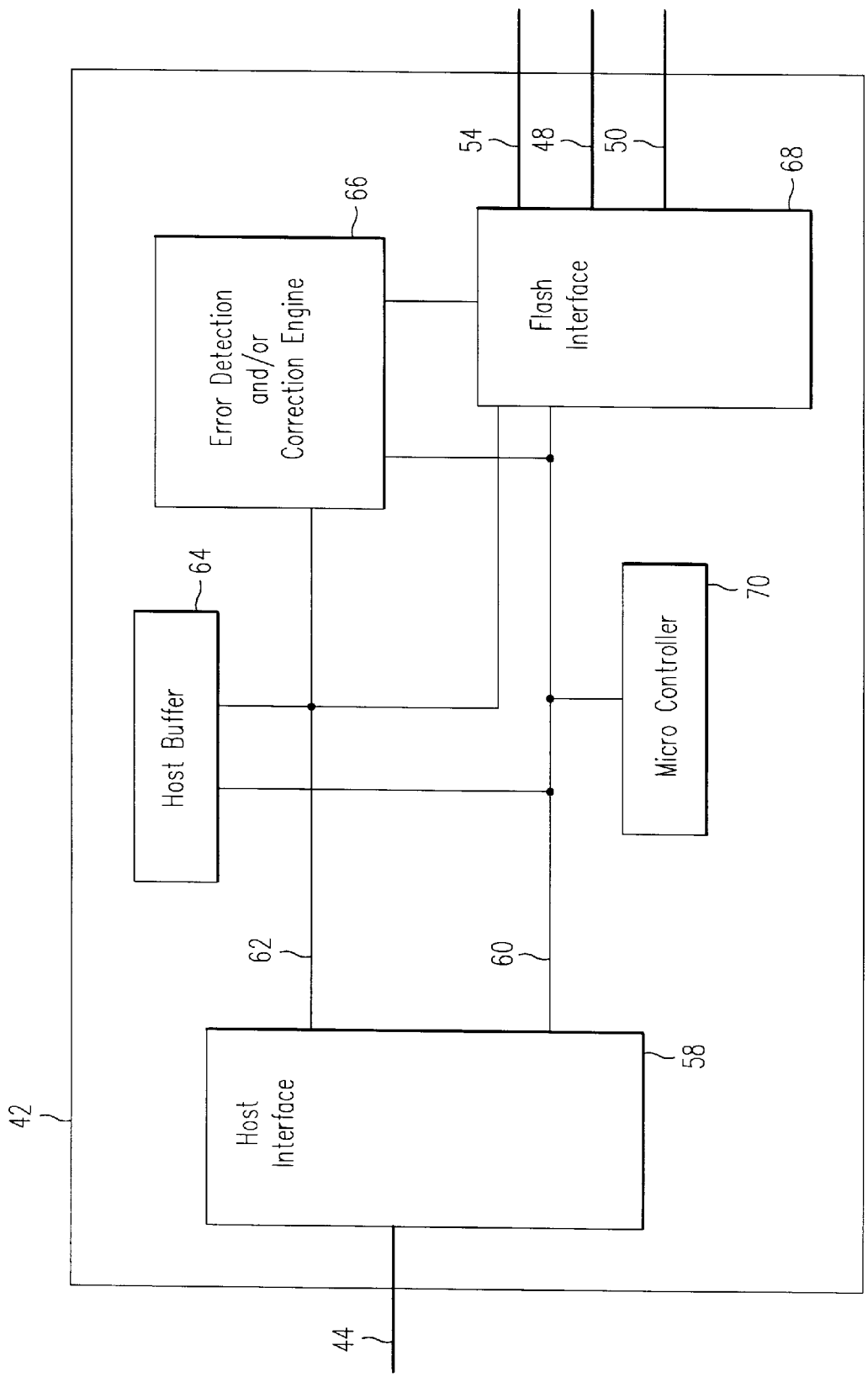
FIG. 6 shows a block diagram design of the controller shown in FIG. 4 including a microcontroller and flash interface logic.

Referring now to FIG. 6, a high-level block diagram of the preferred embodiment controller 42 is shown to include a host interface circuit 58 coupled to the host interface bus 44, the microprocessor interface bus 60, and the buffer interface bus 62 (a bidirectional bus) for communicating information between the host and the remaining circuitry of the controller therethrough. It should be noted that a bus (or busses), as referred to in this patent document, includes multiple conductive lines in parallel, each line representing a bit of information such that, for example, a byte-wide (or 8-bit) bus may carries signals representing values up to 'FF' (in hexadecimal notation) or 256 (in decimal notation). The host buffer circuit 64 is shown coupled through the buffer interface bus 62 to the error detection/correction engine 66 and the flash interface logic 68. The host buffer circuit 64 is further shown coupled to the micro-controller circuit 70, the flash interface logic 68 and the error detection/correction engine 66 through the microprocessor bus 60. Accordingly, the buffer interface bus 62 couples the host buffer circuit 64, the host interface circuit 58, the flash interface logic 68 and the error detection/correction engine 66 together while the microprocessor interface bus 60 couples the host interface circuit 58, the host buffer circuit 64, the microcontroller 70, the flash interface 68 and the error detection/correction engine 66 together.

The host buffer 64 is generally comprised of volatile memory such as RAM for storage and retrieval of sector information by the host (not shown) through the flash interface logic 68. Among other tasks performed by the micro-controller 70, it arbitrates the flow of information to the host buffer circuit 64 such as to avoid simultaneous writing of data to the same location of the buffer circuit by for example, the host and the circuit blocks shown in FIG. 6.

The error detection/correction engine 66 shown in the preferred embodiment in FIG. 6 is known to those skilled in the art for detecting and correcting a limited number of error that may occur within a given sector of information either due to media defects (in this case defects in the flash memory chips) or otherwise. Use of the present invention however, may be effectuated by employing an error detection circuit without the need for correction capability. This is due to the requirement for only detecting and not necessarily correcting any errors existing within a sector as will be obviously later in this discussion.

The flash interface logic 68 will be similarly discussed in more detail later. However, it is important to note that the flash interface logic 68 is shown, in FIG. 6, to be coupled to the flash data bus 54 bidirectionally, to the flash address bus 48 and to the flash control bus 50.

Figure 7:
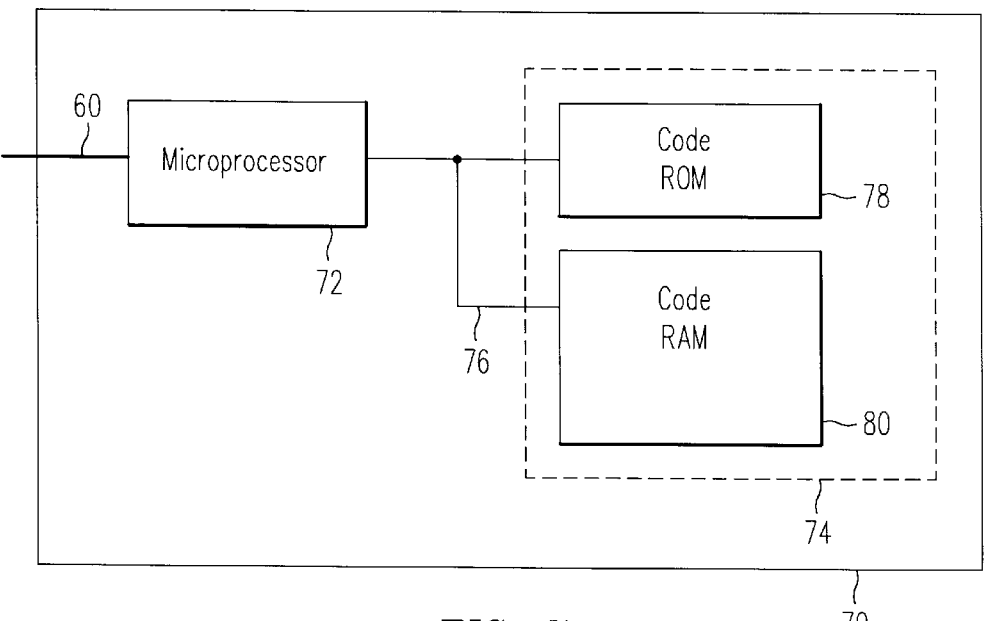
FIG. 7 depicts a high level block diagram of the internal blocks of the microcontroller shown in FIG. 6.

The micro-controller 70 is shown in more detail in FIG. 7 to include microprocessor 72 and code memory 74. Microprocessor 72 is coupled to microprocessor interface bus 60 and through microprocessor memory bus to code memory 74. Within code memory 74, microprocessor memory bus 76 couples microprocessor 60 to code ROM 78 and code RAM 80. As known to those skilled in the art, code ROM 78 is non-volatile memory and stores instructions ultimately executed by microprocessor 72 for performing various functions. In the preferred embodiment of the present invention, microprocessor 72 initiates and executes instructions to check for successful erasure of blocks of sectors, performing this function in conjunction with other circuitry, which will be discussed shortly, to eliminate the use of defective sectors. Code RAM 80, which is volatile memory, may be additionally used to store program instructions for execution by microprocessor 72. The way in which microprocessor 72 works with code memory 74 is no other than designs commonly employed by those skilled in the art; therefore a detailed discussion of the same is not presented.

Figure 8:
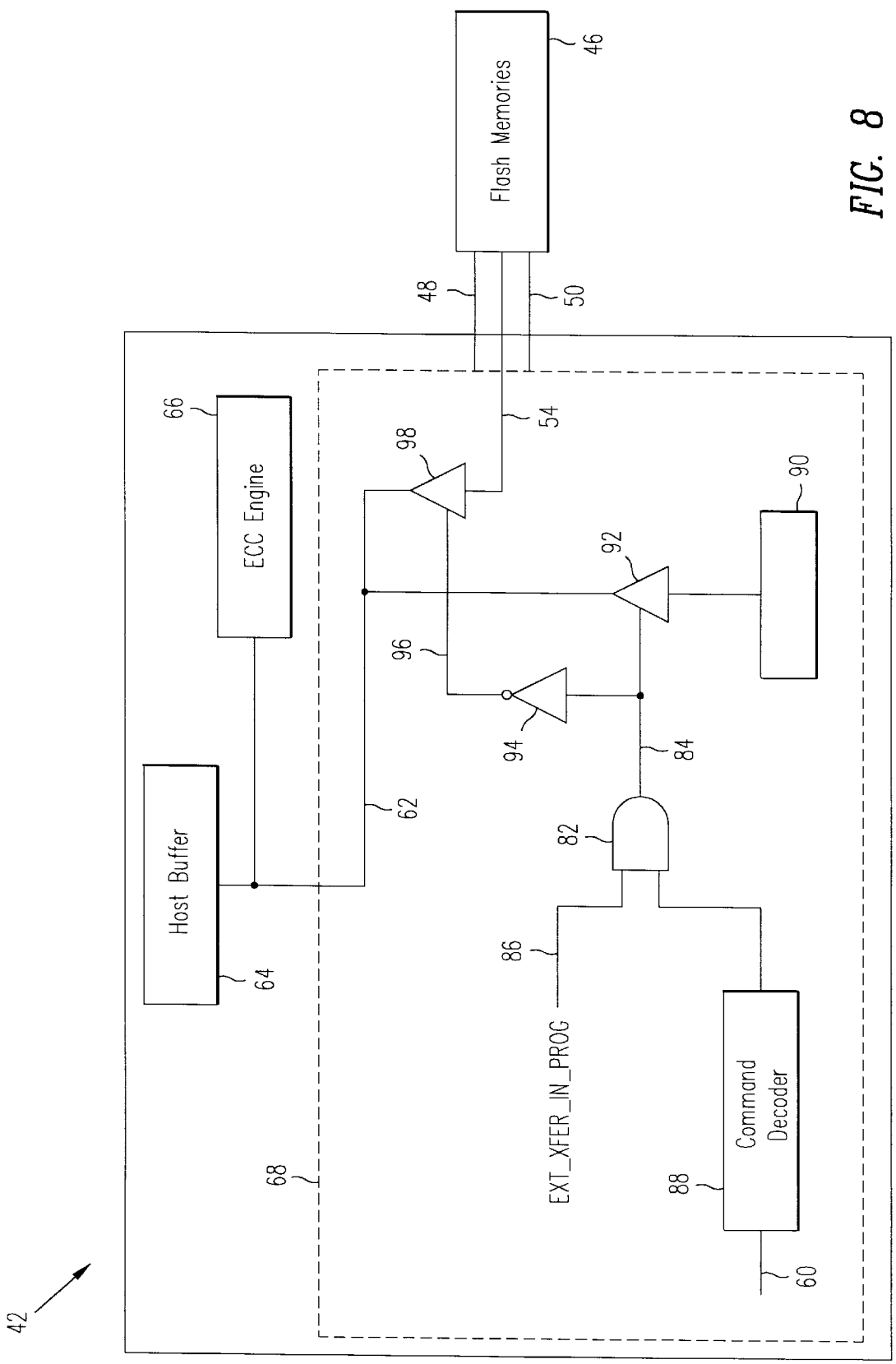
FIG. 8 shows detailed circuitry of the flash interface logic shown in FIG. 6 coupled to flash memory devices within a preferred embodiment of the present invention.

FIG. 8 illustrates the controller 42 wherein further details of the preferred embodiment flash interface logic 68 residing therein are provided in conjunction with some of the previously-introduced circuitry of the controller 42. As noted earlier with respect to FIG. 6, within controller 42, host buffer circuitry 64 and error detection/correction 66 are coupled through the buffer interface bus 62 to flash interface logic 68. Controller 42 is coupled to the array of flash memory chips 46 through the flash data bus 54, the flash address bus 48 and the flash control bus 50, the latter bus transferring control signals such as to indicate read, write, chip select and the like, between controller 42 and the flash memory chips 46 (to start an operation, however, a command is written via the flash data bus 54 to the flash memory chips 46.)

Flash interface circuitry is shown to include a two-input AND gate 82 for developing a data bypass enable signal 84 and responsive through its first input terminal to the external transfer signal 86. Microprocessor interface bus 60 is provided to command decoder block 88 and in response thereto, command decoder block 88 provides input to the AND gate 82 through the latter's second input terminal. Erase code register 90, capable of storing multiple bits (depending upon the width of the register) is coupled to provide input to the extension driver 92 for passing the contents of register 90 onto buffer interface bus 62 when extension driver 92 is enabled. Bypass enable signal 84 is connected to the enable input of extension driver 92 for enabling the latter to allow the contents of register 90 to be placed on the buffer interface bus 62 when bypass enable signal 84 is activated. Bypass enable signal 84 is further coupled to the input of inverter 94, the latter generating the flash data enable signal 96 for enabling the flash data driver 98 when the extension driver 92 is disabled thereby coupling the contents of data bus 54 onto the buffer interface bus 62. It should be noted that flash data driver 98 and extension driver 92 each comprise of multiple drivers for passing multiple bits of information (one driver per bit) from either flash memory chips (through data bus 54) or register 90, respectively, to the buffer interface bus 62.

In operation, the preferred embodiment of the present invention as shown in FIGS. 6–8, functions to verify whether each of the M sectors of a block 56 (shown in FIG. 5), within a flash memory chip 52, is appropriately erased. Each sector is typically comprised of an N-byte data field portion and an M-byte extension field portion as described in the prior art section of this document with respect to FIG. 1. During a write operation wherein the host writes data to the flash memory chips, the data portion of the sector is provided by the host through the host interface 58 (in FIG. 6) and buffer interface bus to the host buffer 64 under the control of the micro-controller 70. The same data is later provided to the error detection/correction engine 66 through the buffer interface bus 62 under the control of the micro-controller 70. The error detection/correction engine 66 encodes the data portion of the sector 10 to generate the extension portion of the sector, which, in its most general meaning, is a code generated by the error detection/correction engine to be unique to the sector's data portion for the purpose of verifying the accuracy of the sector being read from the flash memory devices. The data and extension are transferred in byte-form and include 518 bytes, in accordance with the example provided earlier, although various-sized sectors (and each sector being organized in various numbers of bits) may be employed, as those skilled in the art will appreciate, without departing from the spirit of the present invention. The error detection/correction engine 66 provides the sector of information including data and extension portions to the flash interface 68 for transfer thereof and storage within the flash memory chips 46 through data bus 54. Address bus 48 carries the identity of locations within the flash memory chips where the sector information is to be stored.

During a read operation wherein a sector of information is transferred from the flash memory chips 46 to the host, a sector of information is transferred from locations identified by address bus 48 of the flash memory chips 46 through the data bus 54 to flash data driver 98 of flash interface 68 (in FIG. 8), which is enabled during a read operation to allow the sector information to appear on buffer interface bus 62. Through buffer interface bus 62, the host buffer 64 is provided with the user data portion of the sector and the error detection/correction engine 66 is provided with the sector user data and extension. The error detection/correction engine 66 decodes the sector information to detect errors within the data portion of the sector and to the extent that it can, to correct errors within the sector data by accessing the date from the host buffer 64. To do this, the error detection/correction engine 66 passes the sector information, a byte at a time, through circuitry for generating the unique code associated with the sector data. If errors are detected and corrected, the data portion of the sector is then passed to the host from the host buffer 64 under the control of the micro-controller 70 (in FIG. 6) and through the host interface 58 and host interface bus 44 in much the same way as described for write operations except in the opposite direction.

As noted earlier, once an area of flash memory is written or programmed, it must be erased prior to successful storage of additional information. Therefore, erase operations are readily and frequently carried out by the circuitry depicted in FIGS. 6–8. Furthermore, each time an erase operation is performed, a status register is checked for successful competition thereof. If the erase operation was unsuccessful, a check-for-erase operation is performed to locate the sectors within the erased block that have caused the unsuccessful erase operation of the block.

In the preferred embodiment of the present invention, a block of N sectors is erased with one sector being erased at-a-time during the execution of a check-for-erase command until each of the N sectors is consecutively erased. That is, microprocessor 72 (in FIG. 7) issues a check-for-erase command for each of the sectors within a block that had been erased unsuccessfully. Each time a check-for-erase command is issued, it is decoded by command decoder 88 (in FIG. 8) to generate a logic state '1' on the second input of AND gate 82. For each sector within the block, the check-for-erase command is executed by reading the data portion bytes of the sector in the same way as an ordinary read operation until all of the bytes of the data portion (512 bytes in the example above) are read from the flash memory chips 46. In this respect, the extension transfer signal remains inactive or at logic state '0' thereby inactivating AND gate 82 to disable extension driver 92 and enable flash data driver 98.

Once all of the bytes of the data portion are read into the host buffer 64 and error detection/correction engine 66, the extension transfer signal 86 is activated or at logic state '1' thereby activating AND gate 82 and driving the bypass enable signal 84 to logic state '1'. Accordingly, extension driver 92 is enabled to place the encoded value corresponding to an all '1's or FF (in hexadecimal notation) value, onto the buffer interface bus 62. In this respect, the encoded representation for the value 'FF' (in Hex) for all bytes of the sector is appended to the sector data being provided to the error detection/correction engine 66 through buffer interface bus 62.

If the sector was properly erased, the sector data will contain all '1's and when the error detection/correction engine 66 decodes an all '1's sequence, it will detect a match between the decoded data sequence and the value in the extension bytes generated by register 90 through the extension driver 92. The error detection/correction engine 66 will then indicate no errors found within the sector being checked, as it would for a successful read operation. The microprocessor 72 will then initiate another check-for-erase command for checking the next consecutive sector within the block being checked. If on the other hand, any of the bits in the sector data were not successfully erased, the error detection/correction engine 66 will detect error(s) and will so inform the microprocessor 72 through the microprocessor interface bus 60. Pursuant thereto, the microprocessor marks the sector being checked as defective and issues a check-for-erase command for the next consecutive sector within the block.

During each check-for-erase command, the external transfer signal 86 is activated for a duration equal to the period of time needed to receive all of the extension bytes. In the above example, this time period extends over 6 bytes of extension, after which the extension transfer signal is inactivated or driven to logic state '0' for disabling the extension driver 92. This allows the flash data driver 98 to be activated and ready to receive data bytes of the next sector within the block being erased.

Figure 3:
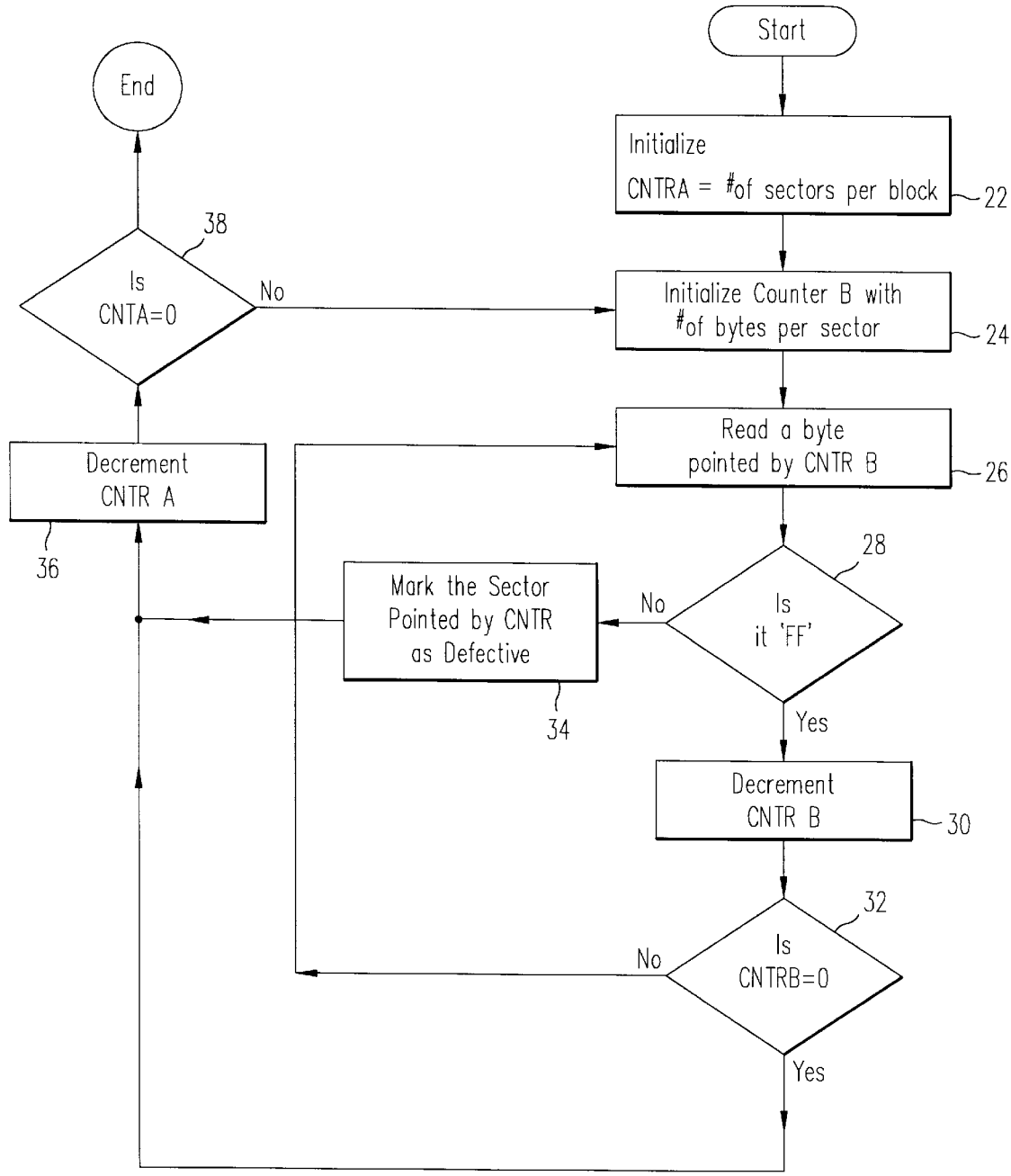
FIG. 3 illustrates a flow chart of the steps performed in prior art techniques for verifying proper erasure of a block of sectors.

It should be appreciated by those skilled in the art that there are alternate ways to implement generation of the value stored in register 90. For example, rather than using a physical register having storage locations N-bit wide, each bit of the extension field may be connected to either ground (to generate a '0' logic state) or to VCC (to generate a '1' logic state). This is sometimes referred to as hard-wiring due to the permanent nature of maintaining the value as apposed to the programmably alterable nature of the register 90. Accordingly, the preferred embodiment of the present invention substantially reduces the time necessary to verify erasures of blocks thereby significantly increasing the system performance relative to prior art systems. In the preferred embodiment of FIG. 7, the microprocessor 72 effectively repeats a sequence of instructions to carry out a check-for-erase command only as many times as there are sectors within the block being erased. As the reader may recall, prior art systems require execution of a number of instructions for as many times as there are bytes in a sector multiplied by the number of sectors within a block multiplied by the number of instructions required to execute the latter (refer to FIG. 3 and discussion of prior art).

It should be noted that the method and apparatus of the present invention contributes to increasing system performance in a number of ways. First, it is often times wasteful and inefficient use of what could be very expensive memory to discontinue the use of an entire block within the memory simply because it has been identified as being defective as is performed by prior art systems. The present invention allows for an efficient way of detecting and locating errors located within bytes or sectors of selected blocks within flash memory devices that have been identified as being defective. In this manner, the remaining portions of the selected blocks, which are without errors or have been corrected may be further employed without significantly effecting system performance thereby allowing further use of good blocks. Second, the larger the block size, the more time needed to check for proper erasures of the block because each location within the block or each sector within the block must be verified to identify the location of the error(s). The present invention significantly reduces such checking time specially for large block sizes. Additionally, flash memory devices, characteristically, tend to wear and become more defective with reuse thereby increasing the need for faster and more efficient ways of detecting errors. In this manner, the present invention is of particular value as flash memory devices are reused because checking for erase operation is likely to be performed more frequently and since the present invention decreases the time required for checking, system performance is significantly increased.

In an alternative embodiment of the present invention, system performance may be additionally increased by further reducing the amount of time needed to erase multiple blocks of data by using multiple flash memory devices in parallel to store a sector of information.

While the present invention has been described above as being employed in a computer or PC system, it has alternative applications in systems such as digital cameras using non-volatile memory devices requiring erase operations and verification thereof.

While the invention has been particularly shown and described with reference to certain embodiments, it will be understood by those skilled in the art that various alterations and modifications in form and detail may be made therein. Accordingly, it is intended that the following claims cover all such alterations and modifications as fall within the true spirit and scope of the invention.

What is claimed:

1. A controller device for use in a digital system having a non-volatile memory device for storing digital information organized in sectors, each sector having a data field and a corresponding extension field, the controller device for performing reading, writing and erasing operations on a selected plurality of sectors and for further verifying successful erasure of the selected erased sectors comprising:

a. an error detection circuit for detecting errors within each of the sector data fields using the corresponding sector extension field; and b. a flash interface circuit coupled to the non-volatile device through a bus including a data bus for receiving an erased sector of information from the non-volatile device through the data bus and operative to pass the data field of the erased sector information and a predetermined extension field to the error detection circuit, wherein said error detection circuit calculates an extension field corresponding to the erased sector data field, compares the calculated extension field to the predetermined extension field and upon the calculated extension field not being equal to the predetermined extension field, detects an error in the erased sector.

2. A controller device as recited in claim 1 wherein the interface circuit further includes a storage location for programmably storing the predetermined extension field.

3. A controller device as recited in claim 1 wherein the predetermined extension field is a fixed value being an encoded representation of an all '1' number in binary notation.

4. A controller device as recited in claim 1 wherein said interface circuit further includes an data driver circuitry coupled between the data bus and the error detection circuitry for providing the data field of the erased sector from the non-volatile memory to the error detection circuit when enabled.

5. A controller device as recited in claim 1 wherein said interface circuit further includes an extension driver circuit for providing the predetermined extension field to the error detection circuit when enabled.

6. A controller device as recited in claim 5 further including an extension field detection logic for causing said extension driver to be enabled when the extension field of the sector being verified is received through the data bus from the non-volatile memory device.

7. A controller device as recited in claim 6 wherein said extension field detection logic further includes an AND gate responsive to an extension transfer signal and a check-for-erase signal and operative to develop a data/extension signal for enabling said data driver circuit and disabling the extension driver circuit when the data field of the erased sector is received through the data bus, and enabling said extension driver and disabling said data driver circuit when the extension field of the erased sector is being received so as to interrupt the extension field of the erased sector and replacing it with the predetermined extension field before the erased sector is provided to said error detection circuit.

8. A controller device as recited in claim 7 wherein said extension field detection logic further includes a command decoder logic block for detecting when a sector is being verified and in response thereto for developing said check-for-erase signal.

9. A controller device as recited in claim 1 further including a microprocessor couple to said interface circuit for causing a check-for-erase command to be executed each time a sector is being verified for successful erasure and for further maintaining count of the number of sectors being verified.

10. A computer system comprising:

a non-volatile memory device for storing digital information organized in sectors, each sector having a data field and a corresponding extension field; and a controller device for performing reading, writing and erasing operations on a selected plurality of sectors and for further verifying successful erasure of the selected erased sectors, said controller device further including, an error detection circuit for detecting errors within each of the sector data field using the corresponding sector extension fields, a flash interface circuit coupled to the non-volatile device through a bus including a data bus for receiving an erased sector of information from the non-volatile device through the data bus and operative to pass the data field of the erased sector information and a predetermined extension field to the error detection circuit, wherein said error detection circuit calculates an extension field corresponding to the erased sector data field, compares the calculated extension field to the predetermined extension field and upon the calculated extension field not being equal to the predetermined extension field, detects an error in the erased sector.

11. A controller device as recited in claim 10 wherein the interface circuit further includes a storage location for programmably storing the predetermined extension field.

12. A controller device as recited in claim 10 wherein the predetermined extension field is a fixed value being an encoded representation of an all '1' number in binary notation.

13. A controller device as recited in claim 10 wherein said interface circuit further includes an data driver circuitry coupled between the data bus and the error detection circuitry for providing the data field of the erased sector from the non-volatile memory to the error detection circuit when enabled.

14. A controller device as recited in claim 10 wherein said interface circuit further includes an extension driver circuit for providing the predetermined extension field to the error detection circuit when enabled.

15. A controller device as recited in claim 14 further including an extension field detection logic for causing said extension driver to be enabled when the extension field of the sector being verified is received through the data bus from the non-volatile memory device.

16. A controller device as recited in claim 15 wherein said extension field detection logic further includes an AND gate responsive to an extension transfer signal and a check-for-erase signal and operative to develop a data/extension signal for enabling said data driver circuit and disabling the extension driver circuit when the data field of the erased sector is received through the data bus, and enabling said extension driver and disabling said data driver circuit when the extension field of the erased sector is being received so as to interrupt the extension field of the erased sector and replacing it with the predetermined extension field before the erased sector is provided to said error detection circuit.

17. A controller device as recited in claim 16 wherein said extension field detection logic further includes a command decoder logic block for detecting when a sector is being verified and in response thereto for developing said check-for-erase signal.

18. A controller device as recited in claim 10 further including a microprocessor couple to said interface circuit for causing a check-for-erase command to be executed each time a sector is being verified for successful erasure and for further maintaining count of the number of sectors being verified.

19. In a digital system having a non-volatile memory device for storing digital information organized in sectors, each sector having a data field and a corresponding extension field, a controller device for performing reading, writing and erasing operations on a selected plurality of sectors and having an error detection circuit for detecting errors within each of the sector data fields using the corresponding sector extension field, a method for verifying successful erasure of the selected erased sectors comprising:

receiving an erased sector of information from the non-volatile device through a data bus;

providing the data field of the erased sector to the error detection circuit;

providing a predetermined extension field in place of the extension field of the erased sector to the error detection circuit;

calculating a new extension field corresponding to the erased sector data field;

comparing the calculated extension field to the predetermined extension field; and upon the calculated extension field not matching the predetermined extension field, detecting an error in the erased sector.

20. A controller device for verifying whether at least a portion of an erased sector of digital information, at least a portion of a sector previously stored in a non-volatile memory and later erased, has been successfully erased, comprising:

an interface circuit for receiving said at least a portion of an erased sector of information from the non-volatile memory; and an error detection circuit for receiving said at least a portion of said erased sector of information from said interface circuit, generating therefrom an extension code, and for using said extension code with a predetermined code to determine whether said portion of said sector has been successfully erased.

21. A method of verifying whether at least a portion of an erased sector of digital information, at lease a portion of a sector previously stored in a non-volatile memory and later erased, has been successfully erased, comprising:

receiving said at least a portion of an erased sector of information from the non-volatile memory;

generating an extension code from said at least a portion of an erased sector of information; and determining whether said portion of said sector has been successfully erased using said extension code with a predetermined code.

* * * * *